United States Patent [19]

Blackwell et al.

[11] Patent Number: 4,508,612
[45] Date of Patent: Apr. 2, 1985

[54] SHIELD FOR IMPROVED MAGNETRON SPUTTER DEPOSITION INTO SURFACE RECESSES

[75] Inventors: Kim J. Blackwell, Owego; Russell T. White, Jr., Binghamton; James W. Wilson, Vestal, all of N.Y.

[73] Assignee: International Business Machines Corporation, Armonk, N.Y.

[21] Appl. No.: 587,098

[22] Filed: Mar. 7, 1984

[51] Int. Cl.³ .............................................. C23C 15/00
[52] U.S. Cl. .................................. 204/298; 204/192 R
[58] Field of Search ............................. 204/298, 192 R

[56] References Cited

U.S. PATENT DOCUMENTS

| 3,361,659 | 1/1968 | Bertelsen | 204/192 R |
|---|---|---|---|
| 3,846,294 | 11/1974 | Vossen | 204/192 R |
| 3,856,654 | 12/1974 | George | 204/298 |
| 3,904,503 | 9/1975 | Hanfmann | 204/192 R |
| 4,301,192 | 11/1981 | Plichta et al. | 427/97 |
| 4,358,686 | 11/1982 | Kinoshita | 204/298 |
| 4,416,755 | 11/1983 | Ceasar et al. | 204/192 S |
| 4,416,759 | 11/1983 | Harra et al. | 204/298 |
| 4,427,524 | 1/1984 | Crombeen | 204/298 |
| 4,434,038 | 2/1984 | Morrison | 204/298 |
| 4,450,031 | 5/1984 | Ono et al. | 204/298 |

Primary Examiner—Arthur P. Demers
Attorney, Agent, or Firm—Mark Levy

[57] ABSTRACT

A system for vacuum depositing a material onto a sample having a surface recess, such as a hole or channel, therein. The system includes a vacuum chamber capable of attaining a high vacuum and a vacuum deposition source in the chamber for emitting atoms. An energy source is connected to the vacuum deposition source to initiate emission of the atoms therefrom. A sample having an upper surface disposed in the vacuum chamber opposite the vacuum deposition source is adapted to receive the atoms emitted from the vacuum deposition source. The sample has a surface recess therein with a wall substantially perpendicular to the plane of the sample. Finally, a component for eliminating undesirable depositing angles of atoms is disposed intermediate the vacuum deposition source and the sample in order to improve the ratio of recess wall to sample surface deposition. Another important feature of the component for eliminating undesirable depositing angles is its ability to reduce heat generated on the sample during the deposition process.

18 Claims, 4 Drawing Figures

SHIELD FOR IMPROVED MAGNETRON SPUTTER DEPOSITION INTO SURFACE RECESSES

BACKGROUND OF THE INVENTION

The present invention relates to a system for vacuum depositing a material onto a sample having one or more surface recesses and, more particularly, for eliminating undesirable depositing angles of atoms on the sample.

In the manufacture of many electronic components, such as integrated circuits, there is a need to deposit metallic films on substrates. Materials such as copper may be deposited on ceramic or glass substrates and then etched or otherwise fabricated into the circuits and/or components.

In the field of plasma deposition, an atom may be displaced from the surface of a target connected to a cathode by a process called sputtering or sputter deposition. In this process, the target may be constructed of copper or another material. The cathode to which the target is attached is subjected to a high negative DC voltage in an inert atmosphere such as argon. The inert gas is ionized forming a plasma from which positive ions escape to bombard the exposed surface of the target and to dislodge by momentum transfer the atoms or clusters of atoms of the target material. It is this dislodging of the target atoms that is known as sputtering. By repeating this process, a number of these primarily neutral atoms move through the space in front of the target, in a relatively high vacuum, until they strike and condense on the surface of a receiver, known as a sample or substrate, which is generally in close proximity to the target. A coating of atomic or molecular layers of target material can thus be built on the substrate. The coating, which is generally less than 1 μm, is called a thin film. It is generally sufficient for the metallization of integrated circuits.

The most commonly used plasma reactors have a target oriented such that the surface of the target is plane parallel to the surface of the sample on which sputtered atoms are to be deposited. It should be noted that atoms emitted from the target are distributed according to a cosine law. That is, the number of atoms ejected from the surface of the target is proportional to the cosine of the angle relative to the perpendicular at which they are ejected. Accordingly, atoms ejected from the target perpendicularly and received at the sample surface perpendicularly provide optimum atom deposition thereof.

Through-holes or viaduct holes (often called vias) are paths for electrical interconnections between a first-level conductive pattern and a second- or higher-level conductive pattern. In order to electrically connect circuits on different substrate levels to each other, precious metal (e.g., palladium) seeding and electroless metal deposition have been used to coat the walls of the vias, often followed by electroplating. Most recently, however, plasma technology has been applied to this problem.

The optimum orientation of target with respect to sample for purposes of depositing sputtered atoms on the surface of the sample has been found to be the worst orientation for coating via walls. This is due to the fact that the vias are generally oriented perpendicular to the plane of the substrate and, therefore, the plane of the target. Perpendicularly ejected target atoms pass directly through the holes and do not coat their walls.

U.S. Pat. No. 3,846,294, issued to Vossen, considers the problem of coating the interior walls of through-holes and attempts to solve it by disposing a substrate containing through-holes directly upon the surface of the target. The target material is sputter-etched from the surface of the target directly beneath the through-holes and is coated on the interior walls thereof.

Unfortunately, the amount of heat generated on the sample during the foregoing and similar processes exceeds safe limits for many, if not most, samples containing polymers and other organic material such as is used in circuit board manufacturing applications. Excessive heat causes difficulties, such as a loss of dimensional stability, polymer integrity and process reproducibility.

U.S. Pat. No. 3,361,659, issued to Bertelsen, teaches the use of a wire grid located between a cathode and an anode for use in a sputtering system. A variable potential is applied to the grid so that either an electric field-free region is created which prevents electron bombardment of the substrate or a small electric field is created in the vicinity of the substrate which induces sorption of gases into the growing film that is deposited on the substrate. The grid can be of positive potential with respect to the cathode to prevent negatively charged OH ions from contaminating the deposited film.

U.S. Pat. No. 3,856,654, issued to George, teaches the use of shields in an apparatus for sputtering thin films on a continuous procession of substrates. Trays of substrates are advanced within a sputtering chamber in a circular path and are incrementally advanced so that each substrate receives a uniform deposit of a thin film. An ionizable inert gas is introduced into the chamber, forced to strike the diffusion shields and scattered across the face of the cathode so that the resultant plasma is of substantial uniform composition. Shields are used in this above-identified reference to achieve uniform distribution of the inert gas ions on the substrate surface.

U.S. Pat. No. 3,904,503, issued to Hanfmann, teaches the use of a shield shaped to conform to plots of lines of constant thickness of the material deposited by a sputtering machine. The shield shades selected portions of the substrate and is withdrawn after a predetermined interval so that the uniformity of the material on the surface of the substrate is increased. Moreover, the area of the shield can be increased or decreased to accommodate changing conditions.

U.S Patent Nos. 4,301,192 and 4,383,495, issued to Plichta, et al, teach the use of fingers coated with ink that are inserted in through-holes and then withdrawn, thereby drawing the ink down into the through-holes and coating the walls thereof.

U.S. Pat. No. 4,416,755, issued to Ceasar, et al, discloses an apparatus and method for producing films on a substrate wherein a vacuum chamber has a plasma generator and a shield means to intercept stray or deflected ions. The presence of the shield minimizes sputtering of the chamber walls by the ion beam. A substance, such as carbon, with relatively low sputtering efficiency, is used to coat the stainless steel interior of the reactor chamber so that the resulting deposited film does not include impurities therefrom. The ion beam is a focused monoenergetic beam of positive ions. Screen and accelerator grid electrodes are used to control the beam energy by varying the bias voltage applied to the grid assembly. The grid assembly also serves as a radiation and mass barrier isolating the substrate from the plasma generating process.

U.S. Pat. No. 4,416,759, issued to Harra, et al, discloses a plasma reactor having blocking means which consists of a primary blocking shield and an ancillary blocking shield. The primary blocking shield intercepts atoms sputtered directly from the cathode target, whereas the ancillary blocking shield intercepts atoms sputtered from the cathode which have been redirected to travel underneath the primary blocking shield onto a region where no deposition is acceptable.

It would be advantageous to provide a system to coat the walls of surface recesses without the use of precious metal seeding, electroless deposition or other so-called wet processes.

It would also be advantageous to minimize heat generated on the sample during such a coating process.

It would further be advantageous to increase the ratio of wall deposition to sample surface deposition.

Moreover, it would be advantageous to allow sputtered atoms to bombard the sample and surface recesses therein at an angle relative to the plane of the sample, while eliminating undesirable, substantially perpendicular angles of atom bombardment.

Finally, it would be advantageous to provide a relatively simple, mechanical means to improve the ratio of sputter deposition into surface recesses such as through-holes and channels relative to deposition onto the upper surface of the sample.

SUMMARY OF THE INVENTION

In accordance with the present invention, there is provided a system for vacuum depositing a material onto a sample having a surface recess, such as a hole or channel, therein. The system includes a vacuum chamber capable of attaining a high vacuum and a vacuum deposition source in the chamber for emitting atoms. An energy source is connected to the vacuum deposition source to initiate emission of the atoms therefrom. A sample having an upper surface disposed in the vacuum chamber opposite the vacuum deposition source is adapted to receive the atoms emitted from the vacuum deposition source. The sample has a surface recess therein with a wall substantially perpendicular to the plane of the sample. Finally, a component for eliminating undesirable depositing angles of atoms is disposed intermediate the vacuum deposition source and the sample in order to improve the ratio of recess wall to sample surface deposition. Another important feature of the component for eliminating undesirable depositing angles is its ability to reduce heat generated on the sample during the deposition process.

BRIEF DESCRIPTION OF THE DRAWINGS

A complete understanding of the present invention may be obtained by reference to the accompanying drawings, when taken in conjunction with the detailed description thereof and in which.

DETAILED DESCRIPTION OF THE PREFERRED EMBODIMENT

Figure 1:
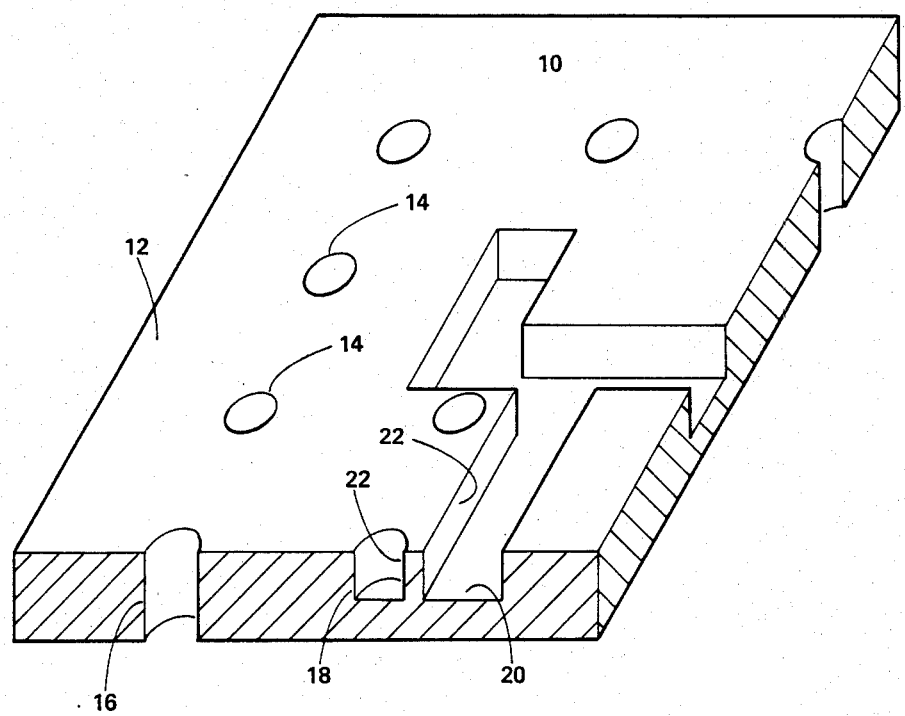
FIG. 1 is a perspective cross-sectional view of a substrate.

Referring now to FIG. 1, there is shown a greatly enlarged view of a substrate or sample 10 which may be constructed of a plastic or some other dielectric material, such as silicon. The upper surface 12 of this substrate 10 is substantially flat, in the preferred embodiment, forming a plane.

Holes 14 are laser, chemically, mechanically or otherwise formed in the substrate 10 by suitable means well-known in the art. The holes 14 may be drilled completely through the substrate 10, in which case they are called through-holes 16. If, however, the holes 14 are drilled only partially through the substrate 10, they are called vias 18. Also formed in the substrate 10 are channels 20 for forming electrically conductive lines. The channels 20 can be manufactured by mechanical means such as milling or by photolithographic techniques or by other suitable means. The generic term for holes 14, through-holes 16, vias 18 and channels 20 is surface recesses.

These surface recesses 14–20 have walls 22 which are substantially perpendicular to the plane of the surface 12 of the substrate 10. In order for a printed circuit board to operate effectively, its through-holes 16, vias 18 and channels 20 must have conductive material covering their respective walls 22. The present invention allows these walls 22 to be covered with conductive material with only a minimal increase in the temperature of the substrate 10. Moreover, the ratio of material deposition onto the walls 22 to material deposition onto the surface 12 is improved as compared to systems heretofore used.

Figure 2:
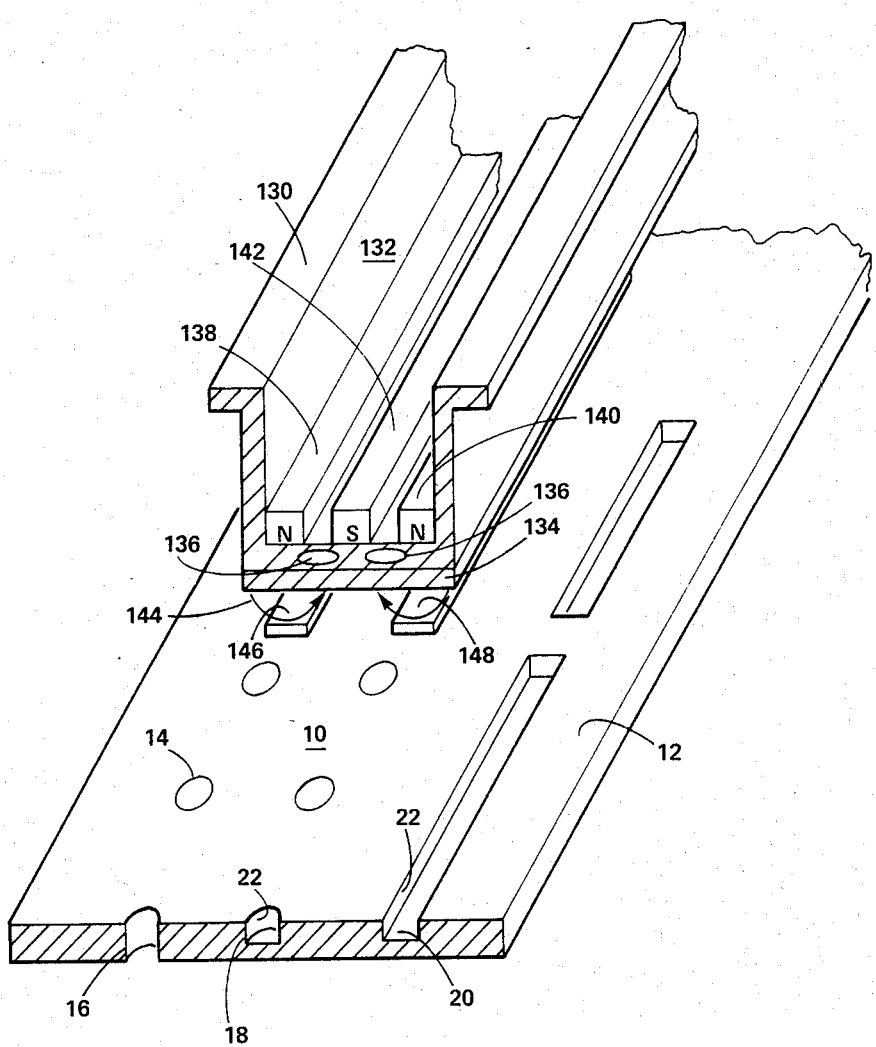
FIG. 2 is a perspective cross-sectional view of a magnetron cathode assembly and substrate in accordance with the present invention.

Referring now also to FIG. 2, there is shown a perspective cross-sectional view of a cathode assembly 130 and the substrate 10. The sample 10 is positioned such that its upper surface 12 is closest to the cathode assembly 130. The cathode assembly 130 is referred to as a planar magnetron and is available from Leybold-Heraeus Technologies, Inc. as Model No. PK-500.

Both the cathode assembly 130 and the substrate 10 are placed in a plasma reactor chamber, not shown, which is filled with ionizable inert gas, such as substantially pure argon gas, at a pressure in the range of approximately 0.5 to 2 millitorr. It should be understood that the pressure of argon in the chamber must be such that the mean free path of atoms is on the order of the distance between the cathode assembly 130 and the substrate 10. In the preferred embodiment, the above-mentioned pressure range is suitable for a displacement of cathode assembly 130 to substrate 10 of approximately 5 cm. Varying the distance between cathode assembly 130 and substrate 10 in other embodiments will, of course, require suitable modification of the optimum argon pressure range. The cathode assembly 130 includes a cathode 132 of heat conducting material, such as aluminum or copper in the preferred embodiment, to which is attached a target 134 constructed primarily of a material to be deposited, such as copper in the preferred embodiment. Substantially pure (99.995%) copper is preferred. The target 134 may be attached to the cathode 132 by bonding, bolting or other suitable means.

The cathode assembly 130 has cooling channels 136 through which water circulates. It should be understood, of course, that the circulating material may be some other liquid or a gas and that other methods of cooling the cathode assembly 130 are in use and can be devised by those skilled in the art.

Magnets 138, 140 and 142, shown truncated in FIG. 2, have both a North pole and a South pole. The magnets 138-142 are placed in the cathode assembly 130 in a completely closed, circumambient arrangement, as hereinbelow described, so that the North poles of the outer magnets 138 and 140 are lowermost in the cathode assembly 130 and the South pole of the center magnet 142 is lowermost in the cathode assembly 130. The magnetic field generated by these magnets 138-142 is depicted generally as reference numeral 144. It can be seen that the magnetic field 144 converges on the center magnet 142 South pole from the outer magnets 138 and 140 of the cathode assembly 130.

Shields 146 and 148 are made of non-reactive material, such as stainless steel in the preferred embodiment, on which deposited copper atoms can accumulate but from which copper can be removed by mechanical or chemical means at a later time. These shields 146 and 148 can also be constructed primarily of the target material (copper) to aid in recycling copper after a deposition process is complete. Target materials tend to be expensive. Consequently, recycling is not only economically feasible, but desirable.

The shields 124 and 126 are attached to the reactor chamber walls by suitable means, not shown and are placed between the cathode assembly 130 and the substrate 10 in such a manner as to block a portion of the atoms sputtered from the target 134 and to prevent them from impinging on the surface 12, as hereinbelow further described. The shields 146 and 148 are either grounded or positively charged to eliminate, by electrical attraction, high energy electrons which may be emitted from the surface of the target 134 before they bombard the upper surface 12 of the sample 10.

Heat generation is a negative by-product of conventional sputtering processes. High energy electrons impinging on the upper surface 12 tend to increase the heat of the sample 10. This problem is especially acute for sputtering onto heat sensitive materials, such as plastics.

Substrates suitable for use as epoxy/glass circuit boards should not be subjected to temperatures above 120° C. for the reasons hereinabove mentioned. In the preferred embodiment, the interior of the reactor chamber and elements therein are initially maintained at room temperature (approximately 22° C.).

The surface recess walls 22 are substantially perpendicular to the plane of the sample upper surface 12. In the preferred embodiment, the plane of the cathode assembly 130 is substantially parallel to the plane of the sample upper surface 12. Accordingly, the surface recess walls 22 are substantially perpendicular to the plane of the cathode assembly 130.

Figure 3:
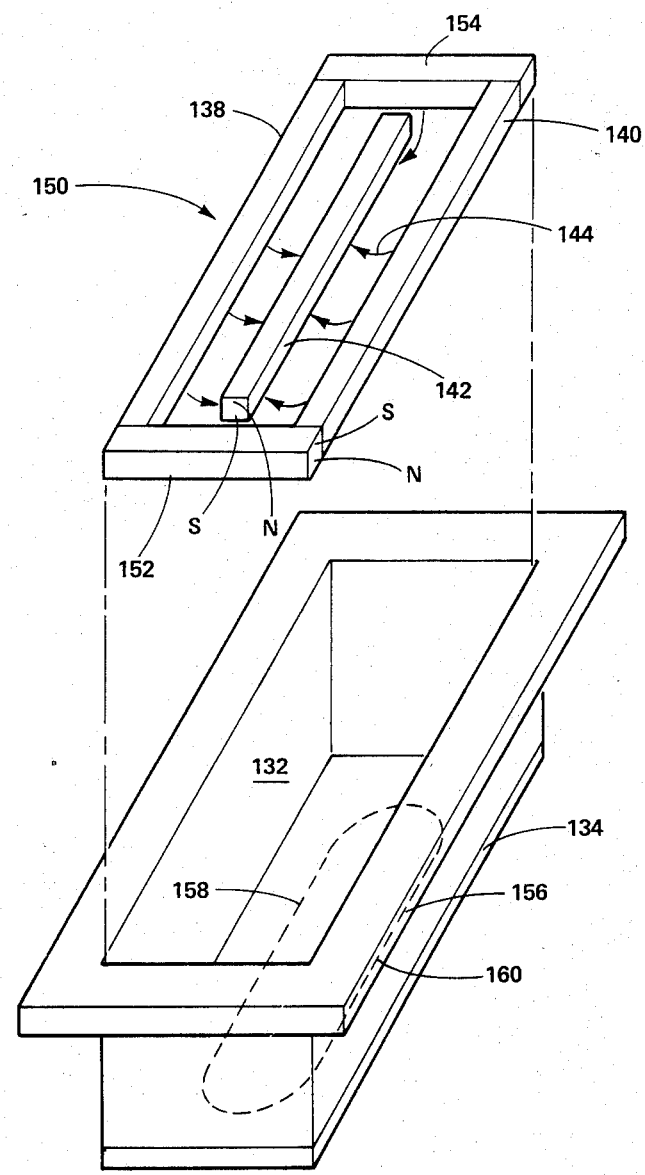
FIG. 3 is a perspective view of a magnet assembly and corresponding cathode assembly.

Referring now also to FIG. 3, the magnet assembly is shown generally as reference numeral 150. The center bar magnet 142 with its South pole oriented downwardly is completely surrounded by a series of bar magnets 138, 140, 152 and 154 having their North poles oriented downwardly and being attached to one another. The magnetic field lines 144 of the circumjacent magnets 138, 140, 152 and 154 form an elliptical racetrack pattern surrounding the center bar magnet 144. These magnetic field lines 144 originate at the periphery 138, 140, 152 and 154 and terminate at the inner bar magnet 142.

In operation, suitable ionizable inert gas, such as argon, is introduced into the reactor chamber after the chamber has been evacuated to a predetermined relatively high level of vacuum to remove any contaminant gases. When power is supplied to the cathode 132, an electrical field is generated which results in ionization of the argon, creating a plasma. The cathode 132 has a copper target 134 attached thereto, as hereinbefore described. The magnet assembly 150, positioned in the cathode assembly 130, generates the magnetic field lines 144 below the target 134 and into the plasma in such a way that a localized area of sputtering in the form of a continuous loop 156 is created. For purposes of descriptive clarity, portions of the continuous sputtering loop 156 are individually identified as reference numerals 158 and 160 in FIG. 3 and are hereinbelow described with reference to a cross-sectional plan view.

Figure 4:
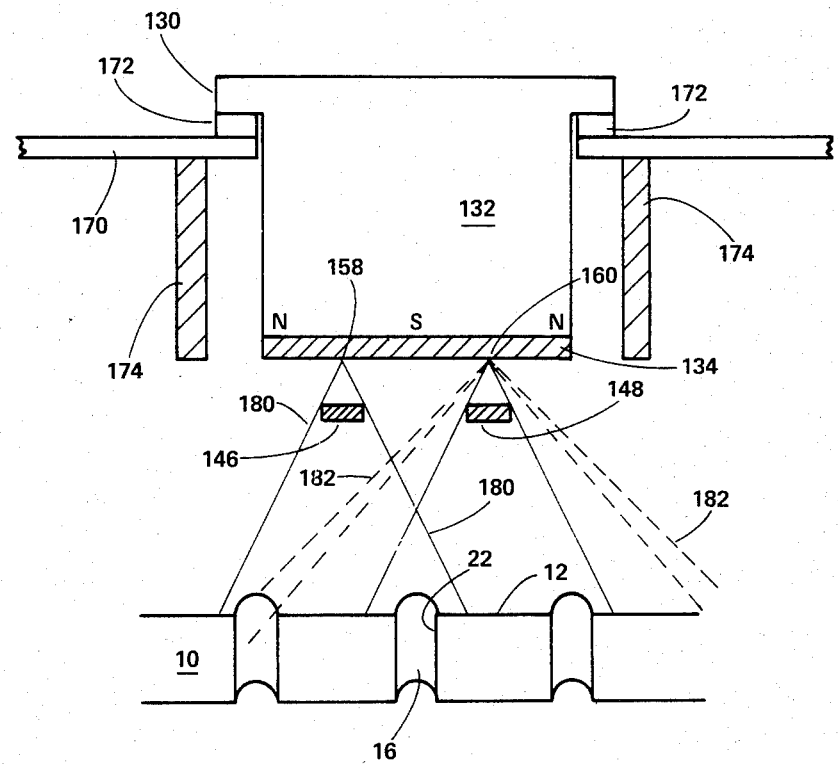
FIG. 4 is a plan view of a magnetron cathode assembly and substrate constructed in accordance with the present invention.

Referring now also to FIG. 4, there is shown a cross-sectional plan view of the magnetron cathode/target assembly used for generating a plasma in a relatively high vacuum for depositing metallic atoms onto a sample. The cathode 132 is affixed to the vacuum chamber 170 by means of an insulator block 172. A stainless steel dark space shield 174 surrounds the target 134 to prevent sputtering from sides of the cathode 132.

A power supply, not shown, is connected to the cathode 132 for producing an electric field. In the preferred embodiment, the power supplied to the cathode 132 is a negative DC voltage in the range of approximately −400 v to −600 v, but it should be understood that other voltage levels may be used, depending upon magnet strength, gas pressure and desired deposition rate. Moreover, other sources of power, such as radio frequency (r.f.) power, may also be used when nonconductive target material is employed.

As hereinabove described, the cathode assembly 130 has contained therein a series of magnets 138, 140, 142, 152 and 154 (FIG. 3) which provide North and South magnetic orientation to the portion of the cathode 132 in closest proximity to the target 134.

The magnetic fields hereinabove described foster localized sputtering of the target 134 at locations 158 and 160 thereon intermediate the North and South poles of the magnetic field. The shields 146 and 148, being placed respectively below the localized sputtering positions 158 and 160 of the target 134, block sputtered copper atoms ejected at certain angles from reaching the sample 10.

It can readily be seen that the shields 146 and 148 block the sputtering angles having the highest flux density, as represented by shadow lines 180, from being deposited onto the upper surface 12. The atom sputtering angles 182 that are allowed to impinge on the substrate upper surface 12 are those that have lower flux density but a greater acute or oblique orientation. These acute angles 182 contribute most to the deposition of hole walls 22 due to the aforementioned cosine law of deposition. Thus, it can be seen that the ratio of hole wall 22 to surface 12 deposition can be improved by the use of these shields 146 and 148.

For epoxy/glass circuit boards, a deposition thickness of about 5000 angstroms of copper is required for proper circuit operation. As hereinabove mentioned, epoxy/glass boards should not be subjected to temperatures in excess of 120° C. during the deposition process. Metallizing polyimide boards, however, requires a thickness of about 80,000 angstroms of copper and can withstand temperatures as high as 350° C. without resulting in adverse operational effects.

During the course of deposition of metal atoms onto the upper surface 12 of the sample 10, the sample 10 is adapted to move relative to the cathode assembly 130. This can be accomplished either by moving the sample 10 relative to a stationary cathode assembly 130 or by moving the cathode assembly 130 relative to a stationary sample 10. Sputtered metal from the target 134 is emitted in line of sight fashion to the upper surface 12 of the sample 10. The relative movement of cathode assembly 130 to sample 10 is required so that copper atoms sputtered from the target 134 can bombard the sample 10 from different angles, thereby ensuring that the surface recess walls 22 are more uniformly coated. The relative movement also ensures that the entire upper surface 12 of the sample 10 is uniformly coated with copper atoms during the deposition process.

It should be understood that the source of metallic emission may be a system for evaporating atoms as well as for sputtering them. Neither does the material to be sputtered necessarily have to be metallic.

It should also be appreciated that although two shields are shown and described in the foregoing preferred embodiment description, the number, shape and orientation of shields may differ depending upon the size of the reactor chamber and the relative dimensions and positions of the cathode assembly, the sample and the surface recesses. But it should be understood that the purpose of the shields is to eliminate sputtered atoms having angles that are undesirable with respect to deposition onto walls of surface recesses. Therefore, the shield design depends on individual system and surface recess dimensions. All such designs are considered to be within the scope of the present invention.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. A system for vacuum depositing a material onto a sample having a surface recess therein comprising:
   (a) a vacuum chamber capable of attaining a high vacuum;
   (b) a vacuum deposition source disposed in said vacuum chamber for emitting atoms;
   (c) an energy source operatively connected to said vacuum deposition source to initiate emission of said atoms therefrom;
   (d) a sample having an upper surface disposed in said vacuum chamber opposite said vacuum deposition source for receiving said atoms emitted therefrom, said sample having a surface recess therein with a wall substantially perpendicular to the plane of said sample; and
   (e) means for eliminating undesirable depositing angles of said atoms, said means disposed intermediate said vacuum deposition source and said sample to improve the ratio of wall to surface deposition.

2. The system in accordance with claim 1 wherein said surface recess is formed by drilling said sample.

3. The system in accordance with claim 2 wherein said surface recess is drilled completely through said sample.

4. The system in accordance with claim 1 wherein said vacuum deposition source is a planar magnetron device.

5. The system in accordance with claim 1 wherein said means for eliminating undesirable depositing angles is a shield.

6. The system in accordance with claim 1 wherein said sample is adapted to move relative to said vacuum deposition source during a deposition process.

7. The system in accordance with claim 5 wherein said shield is at least partially formed of the same type of atoms as are emitted from said vacuum deposition source.

8. The system in accordance with claim 7 wherein said emitted atoms are copper.

9. The system in accordance with claim 5 wherein said shield is electrically grounded with respect to said vacuum chamber.

10. The system in accordance with claim 5 further comprising means operatively connected to said shield for supplying a positive charge thereto to attract relatively high energy electrons before said sample can be bombarded therewith.

11. A system for vacuum depositing a material onto a sample having a channel therein comprising:
    (a) a plasma reactor capable of attaining a high vacuum;
    (b) a target disposed in said plasma reactor for sputtering atoms;
    (c) an energy source operatively connected to said target to sputter said atoms therefrom;
    (d) a substrate proximately disposed to said target for receiving said atoms sputtered therefrom, said substrate having a channel therein with a wall substantially perpendicular to the plane of said substrate; and
    (e) means intermediate said target and said substrate for preventing a portion of said sputtered atoms from being deposited thereon.

12. The system in accordance with claim 11 wherein said means for preventing a portion of said sputtered atoms from being deposited is a shield.

13. A low temperature system for vacuum depositing a material onto a sample having an aperture therein comprising:
    (a) a vacuum chamber;
    (b) a deposition source disposed in said vacuum chamber for emitting atoms;
    (c) an energy source operatively connected to said deposition source to initiate emission of said atoms therefrom;
    (d) a sample having an upper surface disposed in said vacuum chamber opposite said deposition source for receiving said atoms emitted therefrom, said sample having an aperture therein with a wall substantially perpendicular to the plane of said sample; and
    (e) means for eliminating undesirable depositing angles of said atoms, said means disposed intermediate said deposition source and said sample to reduce heat generated thereon during the deposition process.

14. The system in accordance with claim 13 wherein said sample moves relative to said vacuum deposition source during a deposition process.

15. The system in accordance with claim 13 wherein said sample is a substrate for use in the manufacture of circuit boards.

16. The system in accordance with claim 13 wherein said means for eliminating undesirable depositing angles is a shield.

17. The system in accordance with claim 16 wherein said shield is electrically grounded relative to said vacuum chamber.

18. The system in accordance with claim 16 wherein said shield is electrically positive relative to said sample so that high energy electrons are prevented from impinging on said sample and from increasing the temperature thereof.

* * * * *